United States Patent [19]

Raab

[11] Patent Number: 4,506,177
[45] Date of Patent: Mar. 19, 1985

[54] FUNCTION GENERATOR WITH MEANS FOR SELECTIVELY CHANGING THE DISCHARGE TIME CONSTANT

[76] Inventor: Herman P. Raab, 9140 Sherwood La., Indianapolis, Ind. 46240

[21] Appl. No.: 447,260

[22] Filed: Dec. 6, 1982

[51] Int. Cl.³ .................. H03K 5/13; H03K 3/42; G06Q 7/12
[52] U.S. Cl. .................... 307/602; 307/228; 307/490; 307/311
[58] Field of Search .......... 307/228, 602, 490, 261, 307/311; 328/181, 185; 323/322, 326, 288

[56] References Cited

U.S. PATENT DOCUMENTS 3,863,106  1/1975  Haferl ........................ 307/228 X
4,276,860  7/1981  Caparka ...................... 307/228
4,311,956  1/1982  Tolmie, Jr. .................. 323/326
4,445,053  4/1984  Jaeger et al. ................ 307/490

Primary Examiner—Stanley D. Miller
Assistant Examiner—B. P. Davis
Attorney, Agent, or Firm—Barnes & Thornburg

[57] ABSTRACT

A function generator includes an operating voltage source, a capacitor, a first resistor coupled to the capacitor so that the capacitor charges through the first resistor, a second resistor coupled to the capacitor to discharge the capacitor through the second resistor, a third resistor, and an operational amplifier for selectively coupling the third resistor to the capacitor to discharge the capacitor through the third resistor selectively in parallel with the second resistor to alter the discharging time constant of the function generator.

19 Claims, 6 Drawing Figures

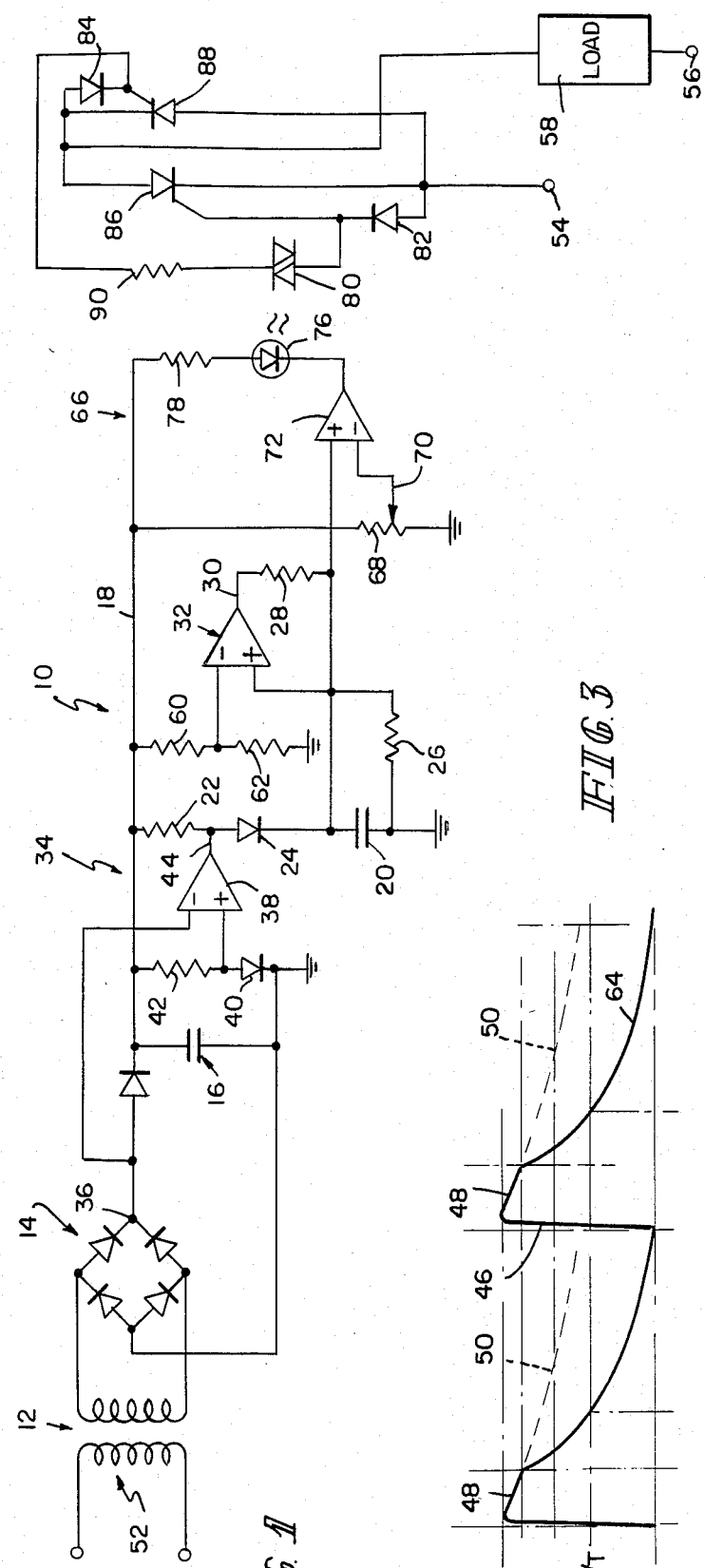
FIG. 1
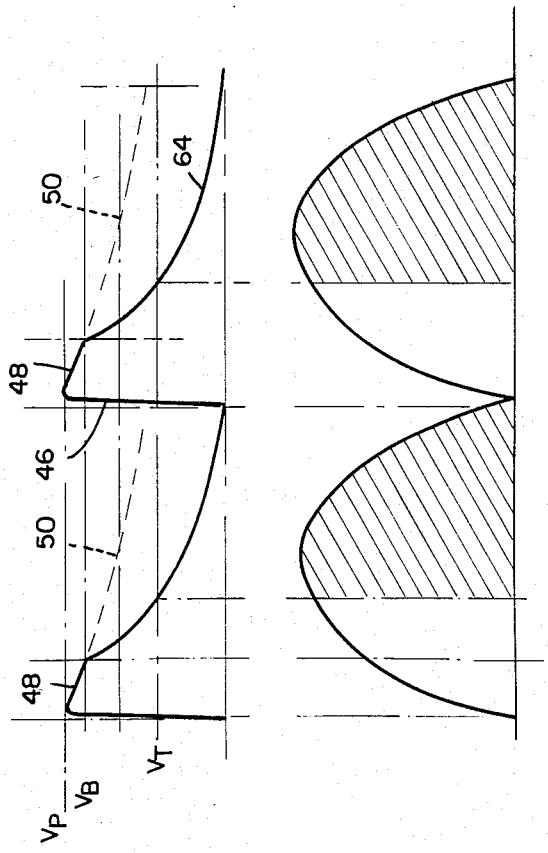
FIG. 2
FIG. 3

FUNCTION GENERATOR WITH MEANS FOR SELECTIVELY CHANGING THE DISCHARGE TIME CONSTANT

This invention relates to electronic circuits for generating functions, such as control functions. This invention is particularly applicable to an energy regulator or control system of the type for controlling the delivery of energy to a load from an alternating current source.

Many energy control systems for controlling the delivery of energy from an alternating current source to a load are known. There are, for example, the systems of U.S. Pat. Nos. 4,287,468; 3,821,634; 3,518,486; 3,493,848; 3,562,627; 3,466,592; 3,665,293; RE 26,119; 3,456,133; 4,311,956; and 3,875,458. Some of these patents discuss the non-linearity problems associated with controlling the delivery of energy from an alternating current source to a load. Many such systems exhibit the characteristic that they do not begin to control the load until a point well after the beginning of a half cycle of the alternating current from the source. Once the control of the flow of current from the source begins, the change in the amount of current delivered to the load is dramatic. In other words, the control is not even approximately linear over the full range of adjustment of the controller. To a great extent, this non-linearity results because of the non-linearity in the alternating current signal itself. Of course, generally, the AC signal is a sine wave or rectified sine wave which increases at a fairly rapid rate during the first third or so of a half-cycle, changes at a rather slower rate during the second third or so of a half cycle, and decreases at a rapid rate during the last third of a half cycle. It will be appreciated that a system which controls based upon the signal level of the alternating current signal from the source might, therefore, be highly sensitive during the first third or so of a half cycle, somewhat more linear during the second third of a half cycle, and highly non-linear during the last third of a half cycle.

In addition, component tolerances must be considered. Frequently, these component tolerances result in variation of the trigger point at which current flow is established to the load from the alternating current source by the controller. The trigger point can fluctuate somewhat during the first third to the first half of a half cycle of the alternating current from the source. Component tolerance further compounds the rather vague control which many prior art load controllers exhibit.

The present invention seeks to provide somewhat greater predictability than prior systems to the control of energy delivery to a load from an alternating current source. This control is sought by means of generation of an analog function or analog signal for comparison with the typically highly non-linear alternating current source signal. The analog function according to the present invention basically is designed to be more linear where the signal from the alternating current source is less linear and somewhat less linear where the signal from the alternating current source is more linear. As a result, the linearity of the comparison between the control function and the alternating current source signal constitutes a compromise between the more and less linear portions of both signals, and therefore is, itself, more linear and predictable. Increased linearity of the control of energy delivery to the load is the result.

According to the invention, a function generator includes means for providing operating voltage, a capacitor, a first resistor, and means for coupling the first resistor to the capacitor for charging the capacitor through the first resistor. The generator further includes a second resistor and means for coupling the capacitor to the second resistor for discharging the capacitor through the second resistor. A third resistor is provided along with means for selectively coupling the third resistor to the capacitor for discharging the capacitor through the third resistor selectively in parallel with the second resistor to alter the discharging time constant of the function generator.

Illustratively, the means for coupling the first resistor to the capacitor includes an operational amplifier and means for coupling the operational amplifier to the source of operating voltage and to the first resistor to charge the capacitor.

Additionally, according to illustrative embodiments, the means for selectively coupling the third resistor to the capacitor includes means for establishing a reference level in the generated function, means for monitoring the level of the generated function, and means for comparing the monitored level to the reference level and for switching in response to such comparison to couple the third resistor in parallel with the second resistor. Illustratively, the reference level generator comprises a resistive voltage divider. The monitor means illustratively comprises an operational amplifier input terminal, and the comparing and switching means comprises an operational amplifier.

Further according to illustrative embodiments, the generator includes a fourth resistor and means for selectively coupling the fourth resistor to the capacitor for selectively discharging the capacitor through the fourth resistor in parallel with the second and third resistors to alter the discharging time constant of the function generator.

According to yet another aspect of the invention, the means for selectively coupling the third resistor to the capacitor includes means for establishing a reference level in the generated function, means for monitoring the level of the generated function, and means for comparing the monitored level to the reference level and for switching in response to such comparison to uncouple the third resistor from the capacitor. Illustratively, the reference level generator comprises a resistive voltage divider. The monitor means comprises an operational amplifier input terminal and the comparing and switching means comprises an operational amplifier.

In addition, according to an illustrative embodiment, the generator includes a fourth resistor and means for selectively coupling the fourth resistor to the capacitor for selectively discharging the capacitor through the fourth resistor in parallel with the one or more of the second and third resistors to which the capacitor is coupled.

The generator illustratively also includes means for coupling the generator to a load to drive the load in response to the generated function. The illustrative means for coupling the generator to a load includes means for establishing a reference level of the generated function, means for monitoring the level of the generated function, and means for comparing the monitored level to the reference level and for generating a load-driving signal in response to such comparison. In an embodiment, the reference level generator comprises a resistive voltage divider, the monitor means comprises an operational amplifier input terminal, and the comparing and switching means comprises an operational amplifier. Illustratively, the generator further includes a light-emitting device for coupling an output of the operational amplifier to the load.

The invention may best be understood by referring to the following description and accompanying drawings which illustrate the invention. In the drawings:

FIG. 1 illustrates a partly block and partly schematic circuit diagram of a system constructed according to the present invention;

FIG. 2 illustrates two half cycles of a full-wave rectified sine wave of voltage;

FIG. 3 illustrates a control function generated by the circuit of FIG. 1;

Figure 4:
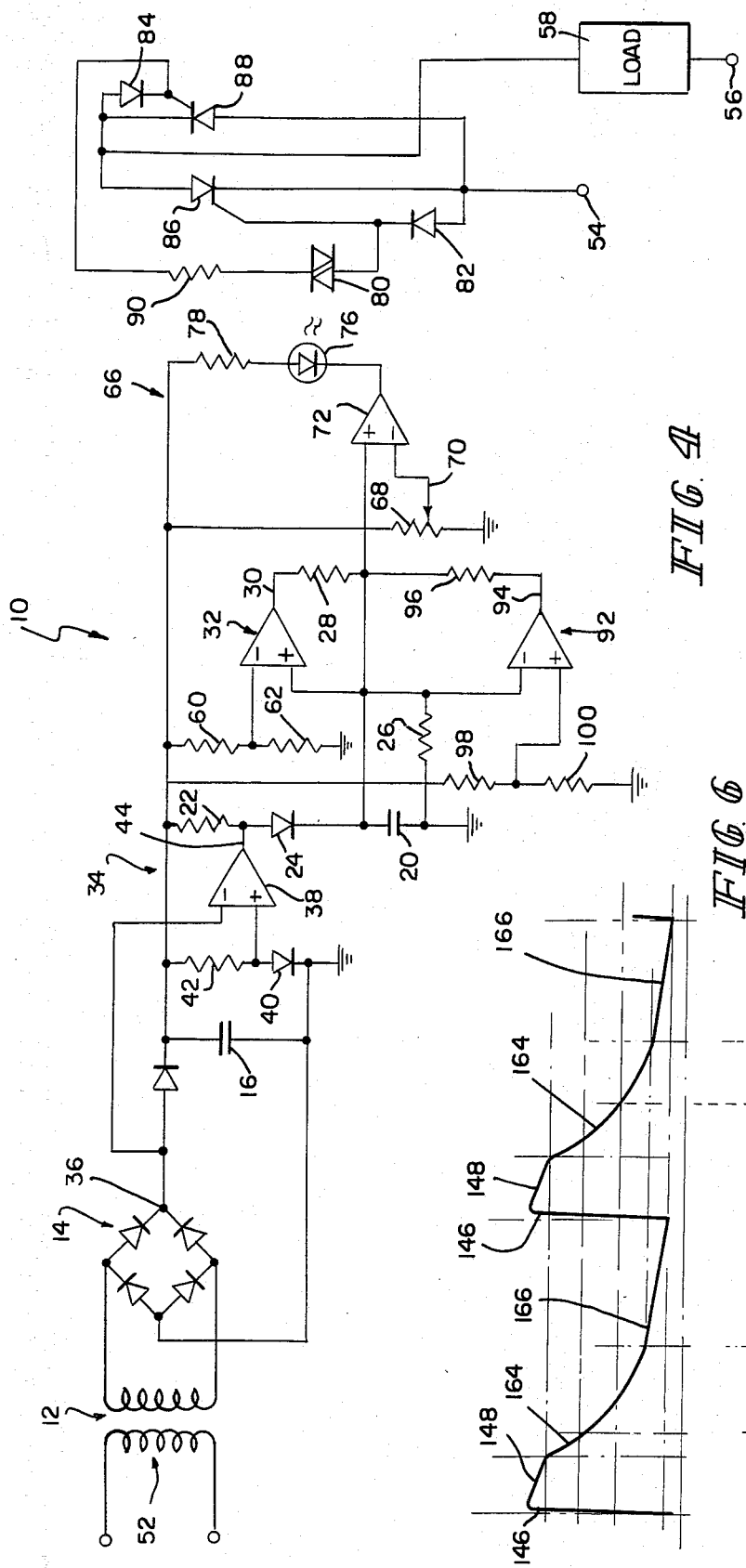
FIG. 4 illustrates a partly block and partly schematic circuit diagram of a modification to the circuit of FIG. 1.

With particular reference to FIG. 1, a function generator 10 includes a transformer 12, a full-wave bridge rectifier 14, and a capacitor 16 which cooperate to provide an operating voltage on a conductor 18 of the function generator 10. The function generator 10 further includes a capacitor 20, a first resistor 22, and a diode 24 coupling resistor 22 to capacitor 20 so that the capacitor may be charged from the potential across conductor 18 to ground through resistor 22 and the minimal impedance of the forward-biased diode 24.

A second resistor 26 is coupled across capacitor 20 to provide a path through which capacitor 20 may discharge at a characteristic rate determined by the capacitance and resistance values of capacitor 20 and resistor 26, respectively. Function generator 10 also includes a third resistor 28, one terminal of which is coupled to capacitor 20 and the other terminal of which is coupled to an output terminal 30 of an operational amplifier 32. The operational amplifier 32 selectively couples the third resistor 28 across the capacitor 20 to discharge the capacitor 20 through third resistor 28 in parallel with the discharging path provided for capacitor 20 through second resistor 26 to alter the discharging time constant of the function generator 10.

The charging circuit for controlling the charging of capacitor 20 through resistor 22 and diode 24 includes an essentially zero-crossing detector 34. In detector 34, the full-wave rectified sine voltage appearing at terminal 36 of the full-wave bridge 14 is coupled to the inverting (−) input terminal of an operational amplifier comparator 38. This signal is compared against a low level DC voltage established across forward-biased diode 40 through resistor 42 from the voltage across capacitor 16. During the very brief interval at the end of one half cycle and beginning of the next half cycle of the signal appearing across terminal 36 to ground (see FIG. 2), the voltage at the non-inverting (+) input terminal of comparator 38 and across forward-biased diode 40 exceeds the potential across terminal 36 to ground. During this very brief interval, the output terminal 44 of comparator 38 is decoupled from ground and capacitor 20 is permitted to charge from conductor 18 through resistor 22 and diode 24, as illustrated at 46 in FIG. 3. However, once the potential on the − input terminal of comparator 38 exceeds the potential on the + input terminal thereof (the potential across diode 40), the output terminal 44 of comparator 38 goes essentially to ground, decoupling capacitor 20 from conductor 18.

Current flow to ground from capacitor 20 is prohibited by the now reverse-biased diode 24. During the very brief interval in which capacitor 20 is permitted to charge through resistor 22, a peak voltage $V_P$ is achieved across capacitor 20, as illustrated in FIG. 3. Contemporaneously with the charging of capacitor 20 through resistor 22, the capacitor is, of course, being discharged through resistor 26. However, the resistance of resistor 22 is orders of magnitude smaller than that of resistor 26, and substantially full charging of capacitor 20 is achieved at a much higher rate than the rate at which resistor 26 discharges capacitor 20.

When the output terminal 44 of comparator 38 goes essentially to ground to decouple capacitor 20 from resistor 22, the discharging time constant of capacitor 20 and resistor 26 begins to control the generated function of FIG. 3. The discharging wave form portion of FIG. 3 for which capacitor 20 and resistor 26 are responsible is illustrated at 48 in FIG. 3. If there were no further circuitry acting upon the generated wave form, the generated wave form would become a somewhat saw-tooth wave form with the short charging time constant portion 46 and the long discharging time constant portions including segments 48 and the broken line segments 50 illustrated in FIG. 3.

The highly linear segment 48 of each wave form of FIG. 3 occurs during a non-linear (i.e., rapidly increasing) portion of the AC wave form appearing across the primary winding 52 of transformer 12 and terminals 54, 56 of the load 58, the current through which is to be controlled by function generator 10. However, the middle third or so of each half cycle of the alternating current wave form of FIG. 2 is somewhat more linear than the first and last thirds of each half cycle. As a result, if a compromise, fairly linear control is to be achieved, the function generator 10 must generate a somewhat less linear wave form to control the somewhat more linear middle third of each half cycle of alternating current wave form illustrated in FIG. 2. To this end, comparator 32 monitors, at its non-inverting (+) input terminal, the potential across capacitor 20. A resistive voltage divider, including resistors 60, 62 coupled between conductor 18 and ground, establishes a reference level on the inverting (−) input terminal of comparator 32 against which the level of the generated function across capacitor 20 is compared. When the actual level of the generated function appearing across capacitor 20 exceeds the reference level at the junction of resistors 60, 62, the output terminal of comparator 32 goes to essentially ground potential. This couples resistor 28 in parallel with resistor 26 and results in a much faster discharging time constant for the capacitor 20, resistor 26, reisistor 28 parallel circuit than existed in the capacitor 20-resistor 26 parallel circuit. This is illustrated in portion 64 of the wave form of FIG. 3. This circuit provides fairly linear control of the current through load 58 with the assistance of a load driver circuit 66.

Circuit 66 includes a potentiometer 68 which is coupled across connector 18 to ground. The wiper 70 of potentiometer 68 establishes a reference level of the generated function across capacitor 20 at which current is to flow in the load 58. The level of the generated function across capacitor 20 is supplied to the non-inverting + input terminal of an op-amp comparator 72. The reference level on the wiper of potentiometer 70 is supplied to the inverting − input terminal of comparator 72. Output terminal 74 of comparator 72 is coupled through a light-emitting diode (LED) 76 and a load resistor 78 to conductor 18. When the potential at the − input terminal of comparator 72 exceeds the actual level of the generated function at the + input terminal of comparator 72, the output terminal 74 of comparator 72 goes effectively to ground and light is emitted from LED 76.

This signal is coupled to a light-activated TRIAC (LATRIAC). LATRIAC 80 is coupled between the cathodes of steering diodes 82, 84, the anodes of which are coupled to the cathodes of silicon-controlled rectifiers (SCRs) 86, 88, respectively. The anode of SCR 88 is coupled to the cathode of SCR 86 and to terminal 54. The anode of SCR 86 is coupled to the cathode of SCR 88 and through load 58 to terminal 56. A load resistor 90 is coupled in series with LATRIAC 80.

It will be appreciated that when the function generator causes LATRIAC 80 to conduct and terminal 54 is positive with respect to terminal 56, current will flow through diode 82, LATRIAC 80, resistor 90, and the gate electrode of SCR 88 to render SCR 88 conductive and permit current to flow from terminal 54 through SCR 88 and load 58 to terminal 56. When terminal 56 is positive with respect to terminal 54 and function generator 10 causes LATRIAC 80 to be conductive, current will flow from terminal 56 through load 58, diode 84, resistor 90, and LATRIAC 80 to the gate of SCR 86, causing SCR 86 to become conductive and permitting current to flow from terminal 56 through load 58 and SCR 86 to terminal 54.

More linear control of the power supplied to load 58 results. The trigger point $V_T$ in FIG. 3, at which load 58 begins to conduct, is adjustable via the wiper 70 of potentiometer 68. If this point is adjusted up into the region 48 of the function of FIG. 3 (above the voltage $V_B$ established at the junction of resistors 60, 62), this control potential on the wiper 70 will be in the linear region, even though the potential across terminals 54, 56 will be increasing in a highly non-linear fashion. Relatively linear control of the current through load 58 will result from portion 48 of the generated function of FIG. 3. On the other hand, if the voltage $V_T$ on wiper 70 is below $V_B$ of the generated function of FIG. 3, the control will be rather less linear for the more linear (i.e., less rapidly changing) regions of the voltage (see FIG. 2) applied across terminals 54, 56. Thus, smaller changes in the adjustment of the wiper 70 of potentiometer 68 will result in somewhat larger changes in the point in the generated function of FIG. 3 at which LATRIAC 80 becomes conductive and permits current to flow through load 58 between terminals 54, 56. Thus, the load 58 circuit will be rather more responsive in this region to changes in the potentiometer 68 setting.

Figure 6:
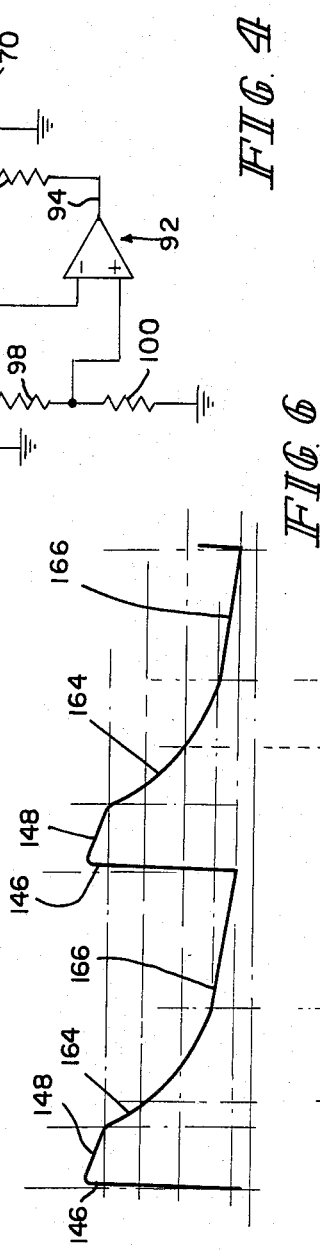
FIG. 6 illustrates a control function generated by the circuit of FIG. 4.
Figure 5:
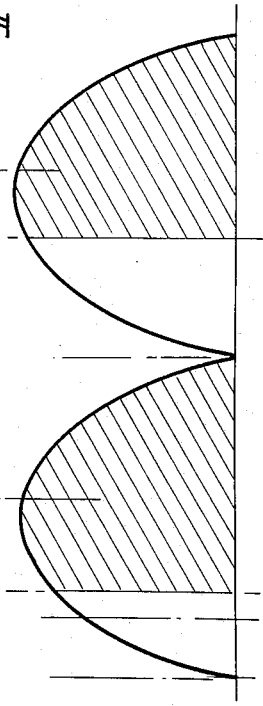
FIG. 5 illustrates two half cycles of a full-wave rectified sine wave of voltage.

This circuit will provide relatively uniform sensitivity across the first two-thirds of each half cycle of the sine wave across the primary 52 of transformer 12 and across terminals 54, 56. It may be desirable under certain circumstances to achieve a higher degree of linearity during the last third of each half cycle of the sine wave form of FIG. 2. To this end, a modification of the circuit of FIG. 1 is illustrated in FIG. 4. In this modification, an additional op-amp comparator 92 includes an output terminal 94 which is coupled through a fourth resistor 96 to the non-inverting (+) input terminal of comparator 72. The inverting (−) input terminal of comparator 92 is also coupled to the non-inverting (+) input terminal of comparator 72 to monitor the generated function appearing across capacitor 20. The non-inverting (+) input terminal of comparator 92 is coupled to the junction of resistors 98, 100 which establish a voltage divider for the voltage appearing across conductor 18 to ground. In this circuit configuration, the output of comparator 92 is conductive until the reference potential established by the voltage divider 98, 100 equals the value of the control function appearing across capacitor 20 and at the − input terminal of comparator 92. Thus, discharge current for capacitor 20 flows through the fourth resistor 96 until the control function level reaches the reference level. At that point, the output terminal 94 of comparator 92 becomes non-conductive, and the control function discharge characteristic becomes more linear. That is, discharge occurs only through resistors 26, 28 and no longer through resistor 96. The control function which results is illustrated in FIG. 6. It will be appreciated that the control function includes the rapid charging region 146, a slow "ramp" discharging region 148, corresponding generally in time to the rapidly increasing potential (see FIG. 5) across the primary winding 52 and terminals 54, 56 associated with the load 58, a rapid discharging region 164 associated generally with the slower changing portion of the alternating current voltage signal (FIG. 5) across primary 52 and terminals 54, 56 associated with load 58, and a slower discharging region 166 associated with the more rapidly changing last third of the half cycle of alternating current voltage (FIG. 5) appearing across primary winding 52 and terminals 54, 56 associated with load 58.

What is claimed is:

1. A function generator comprising means for providing operating voltage, a capacitor, a first resistor, means for coupling the operating voltage to the first resistor, means for coupling the first resistor to the capacitor for charging the capacitor through the first resistor, a second resistor, means for coupling the capacitor to the second resistor for discharging the capacitor through the second resistor, a third resistor, and means for selectively coupling the third resistor to the capacitor for discharging the capacitor through the third resistor selectively in parallel with the second resistor to alter the discharging time constant of the function generator.

2. The generator of claim 1 wherein the means for coupling the first resistor to the capacitor includes an operational amplifier, and means for coupling the operational amplifier to the source of operating voltage and to the first resistor to charge the capacitor.

3. The generator of claim 2 wherein the means for coupling the capacitor to the second resistor comprises a conductor.

4. The generator of claim 2 wherein the means for selectively coupling the third resistor to the capacitor includes means for establishing a reference level in the generated function, means for monitoring the level of the generated function, means for comparing the monitored level to the reference level and for switching in response to such comparison to couple the third resistor in parallel with the second resistor.

5. The generator of claim 4 wherein the reference level generator comprises a resistive voltage divider.

6. The generator of claim 4 wherein the monitor means comprises an operational amplifier input terminal.

7. The generator of claim 4 wherein the comparing and switching means comprises an operational amplifier.

8. The generator of claim 1 and further comprising a fourth resistor and means for selectively coupling the fourth resistor to the capacitor for selectively discharging the capacitor through the fourth resistor in parallel with the second and third resistors to alter the discharging time constant of the function generator.

9. The generator of claim 2 wherein the means for selectively coupling the third resistor to the capacitor includes means for establishing a reference level in the generated function, means for monitoring the level of the generated function, means for comparing the monitored level to the reference level and for switching in response to such comparison to uncouple the third resistor from the capacitor.

10. The generator of claim 9 wherein the reference level generator comprises a resistive voltage divider.

11. The generator of claim 9 wherein the monitor means comprises an operational amplifier input terminal.

12. The generator of claim 9 wherein the comparing and switching means comprises an operational amplifier.

13. The generator of claim 9 and further comprising a fourth resistor and means for selectively coupling the fourth resistor to the capacitor for selectively discharging the capacitor through the fourth resistor in parallel with the one or more of the second and third resistors to which the capacitor is coupled.

14. The generator of claim 1 and further comprising means for coupling the generator to a load for driving the load in response to the generated function.

15. The generator of claim 14 wherein the means for coupling the generator to a load includes means for establishing a reference level of the generated function, means for monitoring the level of the generated function, means for comparing the monitored level to the reference level and for generating a load-driving signal in response to such comparison.

16. The generator of claim 15 wherein the reference level generator comprises a resistive voltage divider.

17. The generator of claim 15 wherein the monitor means comprises an operational amplifier input terminal.

18. The generator of claim 17 wherein the comparing and switching means comprises an operational amplifier.

19. The generator of claim 18 and further comprising a light-emitting device for coupling an output to the load.

* * * * *